(12) United States Patent
Koide et al.

(10) Patent No.: US 7,768,091 B2
(45) Date of Patent: Aug. 3, 2010

(54) DIAMOND ULTRAVIOLET SENSOR

(75) Inventors: Yasuo Koide, Ibaraki (JP); Meiyong Liao, Ibaraki (JP); Antonio Alvarez Jose, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 118 days.

(21) Appl. No.: 11/720,159

(22) PCT Filed: Nov. 22, 2005

(86) PCT No.: PCT/JP2005/021451
§ 371 (c)(1),
(2), (4) Date: Jun. 10, 2008

(87) PCT Pub. No.: WO2006/057246
PCT Pub. Date: Jun. 1, 2006

(65) Prior Publication Data
US 2009/0134403 A1    May 28, 2009

(30) Foreign Application Priority Data
Nov. 25, 2004    (JP) ............................. 2004-340657

(51) Int. Cl.
*H01L 31/00* (2006.01)
*H01L 31/0312* (2006.01)
(52) U.S. Cl. ................. 257/453; 257/77; 257/E21.041; 257/E21.095; 257/E21.323
(58) Field of Classification Search .................... 257/77, 257/E31.011, 79, 453, E21.041, E21.095–E21.096, 257/E21.323
See application file for complete search history.

(56) References Cited

U.S. PATENT DOCUMENTS
4,806,900 A * 2/1989 Fujimori et al. ........... 338/22 R
(Continued)

FOREIGN PATENT DOCUMENTS
JP        59-27754 B2    7/1984
(Continued)

OTHER PUBLICATIONS
Notification of Transmittal of Translation of the International Preliminary Report on Patentability (Form PCT/IB/338) of International Application No. PCT/JP2005/021451 mailed Oct. 25, 2007 with Forms PCT/IPEA/409.
(Continued)

*Primary Examiner*—Thanh V Pham
*Assistant Examiner*—Maria Ligai
(74) *Attorney, Agent, or Firm*—Westerman, Hattori, Daniels & Adrian, LLP

(57) ABSTRACT

In a conventional ultraviolet sensing device using a diamond semiconductor in a light-receiving unit, an Au-based electrode material is used for both a rectifier electrode and an ohmic electrode. However, the Au-based electrode material has fatal defects, such as poor adhesion to diamond, low mechanical strength, and furthermore poor thermal stability.

While avoiding complication of the device structure and exploiting the characteristics of a photoconductive sensing device, by using a carbide compound (TiC, ZrC, HfC, VC, NbC, TaC, CrC, MoC, and WC) of a high melting metal having a high mechanical strength for a rectifier electrode and/or a ohmic electrode, there is provided an extremely heat-stable diamond ultraviolet sensor having a light-receiving sensitivity to ultraviolet light having a wavelength of 260 nm or less.

4 Claims, 3 Drawing Sheets

U.S. PATENT DOCUMENTS

| | | | |
|---|---|---|---|
| 4,982,243 A * | 1/1991 | Nakahata et al. | 257/77 |
| 5,250,149 A * | 10/1993 | Kimoto et al. | 117/97 |
| 5,371,382 A | 12/1994 | Venkatesan et al. | |
| 5,493,131 A | 2/1996 | Miyata et al. | |
| 2005/0174052 A1* | 8/2005 | Niigaki et al. | 313/530 |
| 2006/0043380 A1* | 3/2006 | Hiroshi et al. | 257/79 |

FOREIGN PATENT DOCUMENTS

| | | |
|---|---|---|
| JP | 1-246867 A | 10/1989 |
| JP | 6-53527 A | 2/1994 |
| JP | 7-50424 A | 2/1995 |
| JP | 7-321346 A | 12/1995 |
| JP | 11-97721 A | 4/1999 |
| JP | 11-248531 A | 9/1999 |

OTHER PUBLICATIONS

Michael D. Whitfield et al.; "Thin film diamond UV photodetectors: photodiodes compared with photoconductive devices for highly selective wavelength response"; Elsevier, Diamond and Related Materials, vol. 5, issues 6-8, pp. 829-834, 1996.

Meiyong Liao et al.; "Tungsten carbide Schottky contact to diamond toward thermally stable photodiode", Elsevier, Diamond & Related Materials, vol. 14, pp. 2003-2006, Aug. 8, 2005.

Robert D. McKeag et al.; "Diamond UV photodetectors: sensitivity and speed for visible blind applications", Elsevier, Diamond and Related Material, vol. 7, pp. 513-518, 1998.

Hui Jin Looi et al.; "Metal-semiconductor-metal photodiodes fabricated from thin-film diamond", Applied Physics Letters, vol. 73, No. 22, pp. 3332-3334. May 31, 1999.

Michael D. Whitfield et al.; "Thin film diamond photodiode for ultraviolet light detection", Appl. Phys. Letters, vol. 68, No. 3, pp. 290-292, Jan. 15, 1996.

International Search Report of PCT/JP2005/021451, date of mailing Feb. 14, 2006.

* cited by examiner

DIAMOND ULTRAVIOLET SENSOR

TECHNICAL FIELD

The present invention relates to a diamond ultraviolet sensor.

BACKGROUND ART

It has been known that a diamond semiconductor has a rather large bandgap, such as approximately 5.5 eV (corresponding to a light wavelength of approximately 225 nm), at room temperature, and that in an intrinsic state in which a dopant (impurity) is not added, it behaves as an insulating material. As a method for growing a single crystal thin film, a microwave-excited plasma vapor growth method (Patent Document 1) which is performed in an atmosphere substantially containing carbon and hydrogen, such as $CH_4$ (methane) and $H_2$ (hydrogen) gases, has been developed and widely used. In addition, in the microwave-excited plasma vapor growth method, a method for controlling a p-type (primary carrier is a hole) electrical conduction property by addition of B (boron) as a dopant has also been widely used.

Since the microwave-excited plasma vapor growth method is a vapor growth method using an atmosphere containing hydrogen, it has been known that a grown diamond single crystal film surface is a surface substantially covered with hydrogen. That is, it has been known that a C—H molecular structure (hereinafter referred as "hydrogenation") in which dangling bonds of carbon (C) atoms are terminated by hydrogen (H) atoms by bonding is present on the surface, and that by this hydrogenation, in the diamond in the vicinity of the surface thereof, a surface conductive layer is generated, that is, holes, which are primary carriers, are locally present in the vicinity of the surface (within 2 nm). It has also been known that this surface conductive layer is also present in undoped and boron doped (100) and (111) plane single crystal thin films and a polycrystalline thin film.

The generation mechanism of this surface conductive layer has caused a great controversy on a global basis; however, at least from an experimental point of view, it has already been known that the surface conductive layer (1) is stably present up to approximately 200° C., and (2) is generated only at a hydrogenated diamond surface. It has also been known that by a solution treatment (oxidation treatment) removing surface-bonded hydrogen, for example, by a treatment of immersion in a mixed solution of boiled sulfuric acid and nitric acid, this surface conductive layer disappears, and the inventors of the present invention also confirmed this fact.

As a light sensing device which detects ultraviolet light irradiated to a light-receiving unit by the change in electrical resistance thereof or the change in amount of light induced current, heretofore, there have been conceived, for example, devices using, as a solid material of the light-receiving unit, a Si semiconductor having a detection sensitivity also to visible light and the like in a wavelength of 400 to 650 nm, and an $Al_xGa_{1-x}N$ ($0 \leq x \leq 1$) semiconductor and a diamond semiconductor, which has no detection sensitivity to the above visible light and the like and to noise light in an infrared region.

A light detection principle of these light sensing devices is to detect the change in electrical resistance or the change in amount of light induced current caused by carriers of electron-hole pairs which are generated in a semiconductor by irradiation of light having an energy more than a bandgap to the semiconductor in a light-receiving unit. Hence, a device structure can be formed in accordance with a two-terminal device composed of a semiconductor and two electrodes bonded thereto, and as a result, an extremely simplified ultraviolet sensor can be manufactured.

As the light sensing device made of a two-terminal device, there are widely used a metal-semiconductor-metal structure (MSM) device having a comb type electrode structure, and a Schottky type device which has two different type electrodes, i.e., a rectifier electrode and an ohmic electrode, and which detects light through the rectifier electrode.

As an example in which a diamond semiconductor is used for an ultraviolet sensing device, for example, in Non-Patent Document 1, among MSM type photoconductive sensing devices, each of which uses a surface conductive layer of a polycrystalline diamond thin film in a light-receiving unit and each of which uses Ti and Au for a first layer electrode and a second layer electrode, respectively, a device has been disclosed that achieves a detection sensitivity of 0.03 A/W to irradiation of ultraviolet light having a wavelength of 200 nm. In addition, in Non-Patent Document 2, among MSM type photoconductive sensing devices, each of which uses a polycrystalline diamond film in a light-receiving unit, a surface conductive layer of the diamond film being removed by an oxidation treatment, and each of which uses Ti and Au for a first layer electrode and a second layer electrode, respectively, a device has been disclosed that achieves a detection sensitivity of 0.02 A/W to irradiation of ultraviolet light having a wavelength of 200 nm. In addition, in Non-Patent Document 3, among Schottky type sensing devices in each of which a rectifier electrode of Au and an ohmic electrode of Ti/Ag/Au (in this case, "/" indicates the order of deposition) are formed on a polycrystalline diamond thin film, although the detection sensitivity is not known, a device has been disclosed that has a visible light blind ratio of five orders of magnitude, which is obtained between irradiation of light having a wavelength of 200 nm and that of light having a wavelength of 600 nm.

In addition, as an example of a prior art, in Patent Document 2, a technique has been disclosed relating to a diamond ultraviolet sensing device which uses in a light-receiving unit a diamond polycrystalline thin film or (100) and (111) oriented thin films, each having a thickness of 40 μm, and a surface from which bonded hydrogen is removed; however, this device has insufficient detection sensitivity for practical use. In Patent Document 3, a diamond ultraviolet sensing device has been disclosed which uses a surface conductive layer of diamond in a light-receiving unit. However, the detection sensing wavelength of this device covers the entire visible light region, this device is a photoconductive type sensing device using a defect level in the bandgap of diamond, and hence ultraviolet light having a wavelength of 250 nm or less cannot be selectively detected.

Non-Patent Document 1: J. Looi, M. D. Whitfield, and R. B. Jackman, Appl. Phys. Letts. 74, 3332 (1999)

Non-Patent Document 2: R. D. McKeag and R. B. Jackman, Diamond Relat. Mater. 7, 513 (1998)

Non-Patent Document 3: M. D. Whitfield, S. S M. Chan, and R. B. Jackman, Appl. Phys. Letts. 68, 290 (1996)

Patent Document 1: Japanese Examined Patent Application Publication No. 59-27754

Patent Document 2: Japanese Unexamined Patent Application Publication No. 11-248531

Patent Document 3: Japanese Unexamined Patent Application Publication No. 11-097721

DISCLOSURE OF INVENTION

Problems to be Solved by the Invention

In a conventional ultraviolet sensing device using a diamond semiconductor in a light-receiving unit, for both a rectifier electrode and an ohmic electrode, electrodes (Au-based electrode material) containing Au as a base material, represented by Ti/Au (in this case, "/" indicates the order of deposition), are used. However, the Au-based electrode material has fatal defects, such as poor adhesion to diamond, low mechanical strength, and furthermore poor thermal stability.

Means for Solving the Problems

The present invention provides, while avoiding complication of the device structure and exploiting the characteristics of a photoconductive sensing device, an extremely heat-stable diamond ultraviolet sensor having a light-receiving sensitivity to ultraviolet light with a wavelength of 260 nm or less by using a carbide compound (TiC, ZrC, HfC, VC, NbC, TaC, CrC, MoC, and WC) of a high melting point metal which has a high mechanical strength for a rectifier electrode and/or a ohmic electrode.

In particular, there is provided a light sensing device which detects ultraviolet light having a wavelength of 260 nm or less irradiated to a light-receiving unit by the change in electrical resistance thereof or the change in amount of light induced current and which has an extremely small detection sensitivity to visible light having a wavelength of 400 nm or more, and in addition, a flame sensor and an ultraviolet sensor, which use the light sensing device described above, are also provided. Various ultraviolet sensing devices, such as a photoconductive type, a pn type, a pin type, and a Schottky type device, have already been manufactured. Above all, the present invention relates to a photoconductive type or a Schottky type sensing device, having two terminal electrodes.

According to the present invention, there is provided (1) a diamond ultraviolet sensor which is a photoconductive type or a Schottky type light sensing device having two terminal electrodes to detect light irradiated to a light-receiving unit by the change in electrical resistance of a light-receiving unit material or the change in light induced current, wherein a diamond surface from which a surface conductive layer is removed is used for bonding interfaces between the light-receiving unit and the electrodes, a rectifier electrode uses at least one carbide compound of a high melting point metal element, which is selected from the group consisting of TiC, ZrC, HfC, VC, NbC, TaC, CrC, MoC, and WC, as a single layer, and an ohmic electrode has the structure in which a single metal reactable to form a solid solution with a carbide or carbon by reaction with diamond is used as a first layer, and in which at least one carbide compound of a high melting point element, which is selected from the group consisting of TiC, ZrC, HfC, VC, NbC, TaC, CrC, MoC, and WC, is used as a second layer.

In addition, according to the present invention, there is provided (2) a diamond ultraviolet sensor which is a photoconductive type or a Schottky type light sensing device having two terminal electrodes to detect light irradiated to a light-receiving unit by the change in electrical resistance of a light-receiving unit material or the change in light induced current, wherein a diamond surface from which a surface conductive layer is removed is used for bonding interfaces between the light-receiving unit and the electrodes, and in at least one of the electrodes, an electrode layer in contact with the diamond surface is formed of at least one carbide compound of a high melting point metal element, which is selected from the group consisting of carbide of TiC, ZrC, HfC, VC, NbC, TaC, CrC, MoC, and WC.

In addition, according to the present invention, there is provided (3) a diamond ultraviolet sensor which is a photoconductive type or a Schottky type light sensing device having two terminal electrodes to detect light irradiated to a light-receiving unit by the change in electrical resistance of a light-receiving unit material or the change in light induced current, wherein a diamond surface from which a surface conductive layer is removed is used for bonding interfaces between the light-receiving unit and the electrodes, and at least one carbide compound of a high melting point metal element, which is selected from the group consisting of TiC, ZrC, HfC, VC, NbC, TaC, CrC, MoC, and WC, is used for a topmost layer portion of an ohmic electrode.

In addition, according to the present invention, in the diamond ultraviolet sensor according to one of the above (1), (2), (3), and (4) the diamond surface from which the surface conductive layer is removed is a surface formed by an oxidation treatment performed for a hydrogen terminated diamond surface.

Advantages

Compared to a conventional diamond ultraviolet sensor which uses a laminate or an alloy electrode containing Au, the thermal stability is extremely superior, and a visible light blind ratio of five orders of magnitude is achieved. In addition, also as electrical properties of a photoconductive type or a Schottky diode, an inverse current of $10^{-14}$ A or less at room temperature and a rectifier ratio with forward current of nine orders of magnitude or more are obtained. The photoconductive type or the Schottky type ultraviolet sensing device of the present invention has a superior thermal stability such that the electrical and optical properties thereof are not degraded by a heat resistance test performed at 500° C. for 2 hours.

BEST MODE FOR CARRYING OUT THE INVENTION

An ultraviolet sensor of the present invention is a photoconductive type or a Schottky type device having two terminal electrodes; for a rectifier electrode in contact with diamond, a single layer of WC (thickness: 2 nm), which is a carbide compound of a high melting point metal element, is used; and for an ohmic electrode, a two-layered structure is used in which Ti (thickness: 10 nm), which is a reactive metal with diamond, is used as a first layer, and WC (thickness: 10 nm), which is a carbide compound of a high melting point metal element, is used as a second layer.

In the rectifier electrode, a high melting point metal carbide compound which causes no metallurgical reaction with diamond must be used. As the ohmic electrode, an electrode having a two-layered structure must be used, and it is necessary to use a single metal element reactable with diamond by a heat treatment as the first layer and a high melting point metal carbide compound which does not cause reaction with diamond as the second layer. The heat treatment may be performed in a vacuum atmosphere or an argon gas atmosphere at a temperature of up to 800° C., and by this heat treatment, the reactable single metal forms a solid solution with a carbide or carbon in the vicinity of a bonding interface between the diamond and the electrode. In order to obtain an ohmic electrode having linear current-voltage characteristics, the first layer metal bonded to diamond may be a metal which can form a solid solution with a carbide or carbon by reaction with diamond through the heat treatment, that is, may be a reactable single metal, and in an example, for example, Ti was used. However, since a high melting point metal carbide compound is an extremely heat-stable intermetallic compound, in order to obtain a heat-stable ultraviolet sensor, a reactive Ti metal having ohmic properties must be covered with a high melting point metal carbide compound.

In addition, a high-quality diamond semiconductor in terms of electrical and optical properties can be obtained on a diamond (100) or (111) plane single crystal substrate, which is formed by high-pressure synthesis, by an epitaxial growth using a microwave-excited plasma vapor growth method in which $CH_4$ (methane) and $H_2$ (hydrogen) are used as stating material gases. Also in the example of the present invention, this method is used; however, since a hydrogenated surface conductive layer is present on a grown surface of diamond, an oxidation treatment of the hydrogen terminated surface of diamond is performed by using a mixed solution containing boiled sulfuric acid and nitric acid, and a diamond surface from which the surface conductive layer is removed is used as bonding interfaces between the light-receiving unit and the electrodes. In both the rectifier electrode and the ohmic electrode, the diamond surface from which the surface conductive layer is removed is used for the bonding interfaces with the electrodes.

According to the present invention, in a photoconductive type or a Schottky type sensing device having a rectifier electrode and an ohmic electrode, shown in FIGS. 1 and 2, by irradiation of ultraviolet and visible light of a wavelength of 220 to 600 nm to this oxidation treated surface of diamond through this rectifier electrode, a visible light blind ratio of five orders of magnitude is realized.

Example 1

The Schottky type sensing device shown in FIGS. 1 and 2 was formed in accordance with the following process, and the current-voltage (I-V) characteristics and light response characteristics to ultraviolet light were measured.

As shown in FIG. 1, on a diamond (100) single crystal substrate 1 which was formed by high-pressure synthesis, had a length of 2.5 mm, a width of 2.5 mm, and a thickness of 0.5 mm, and had a nitrogen content corresponding to that shown in Class Ib, a diamond epitaxial single crystal film 2 containing B (boron), which was a p-type dopant element, was grown to have a thickness 0.7 μm by a microwave-excited plasma vapor growth method which used $CH_4$ (methane) as a starting material gas, $H_2$ (hydrogen) as a dilution/carrier gas, and furthermore hydrogen diluted $B(CH_3)_3$ (trimethylboron) at a concentration of one percent by volume (0.01) as a starting material gas of a dopant B.

In this example, the growth conditions were as follows. The substrate temperature was 800° C., the growth pressure was 80 Torr, and the microwave power was 360 W. In addition, the $CH_4$ flow rate was 500 sccm, $CH_4/H_2$ concentration ratio was 0.08% (vol), $B(CH_3)_3/CH_4$ concentration ratio was 3 (vol) ppm, and the growth time was 3 hours.

The diamond (100) plane epitaxial single crystal film 2 thus grown was immersed in a mixed solution of boiled sulfuric acid and nitric acid for 15 minutes for an oxidation treatment and was then processed by overflowing washing using ultra pure water. Subsequently, ultrasonic cleaning was performed separately using acetone and isopropyl alcohol, and by a photolithographic method, patterning of a resist for forming a Ti/WC (in this example, "/" indicates the order of deposition) electrode indicated by reference numeral 3 shown in FIG. 1 and by reference numeral 3 shown in FIG. 2 was performed.

Subsequently, Ti (thickness: 10 nm) and WC (thickness: 10 nm) were sequentially deposited by sputtering of a Ti and a WC target material to form a first and a second layer, respectively, by a magnetron sputtering method using an Ar gas, followed by performing a lift-off method, so that the Ti/WC electrode was formed. Next, by performing a heat treatment at 500° C. for 1 hour in an Ar atmosphere, an ohmic electrode was formed.

Subsequently, after overflowing washing with ultra pure water was performed, patterning of a resist for a WC electrode indicated by reference numeral 4 shown in FIG. 1 and by reference numeral 4 shown in FIG. 2 was performed again by a photolithographic method. Next, by a sputtering method in a manner similar to that described above, WC (thickness: 2 nm) was deposited, followed by performing a lift-off method, so that a WC rectifier electrode was formed.

The width (corresponding to 1L shown in FIGS. 1 and 2) between the Ti/WC electrode and the WC electrode was 10 μm, and the diameter (corresponding to 2L shown in FIGS. 1 and 2) of the WC electrode was 200 μm. The thermal stability was evaluated such that after this ultraviolet sensor was processed by a heat treatment in an Ar atmosphere, the changes in electrical and optical properties were measured.

The Schottky type sensing device thus formed was placed in a vacuum chamber containing a two-terminal prover, and the inside of the chamber was maintained at a vacuum degree of 0.05 Pa by a turbo molecular pump. The I-V characteristics were measured by a two-terminal method. The light response characteristics were measured by irradiating light emitted from a xenon mercury lamp, which was monochromated in a range of 220 to 600 nm by a spectroscope, to the above ultraviolet sensing device through a quartz window.

FIG. 3a shows I-V characteristics measured in a dark room in which light irradiation was not performed to a sensing device before processed by a heat treatment, and FIG. 3b shows I-V characteristics measured while ultraviolet light having a wavelength of 220 nm was irradiated. As shown in FIG. 3a, an inverse dark current obtained when the device is not irradiated with ultraviolet light was $10^{-14}$ A or less, which was not more than the detection limit, at a voltage up to 30 V, and it was found that an extremely small dark current could be realized. The rectifier ratio with a forward current value was nine orders of magnitude or more, and hence superior Schottky characteristics could be obtained.

On the other hand, as shown in FIG. 3b, by irradiation of ultraviolet light having a wavelength of 220 nm, a light induced current at an inverse voltage of 2 V or more was larger by approximately three orders of magnitude than the inverse dark current. The I-V characteristics and the light response characteristics were not change even after a heat treatment was performed at 300° C. for 1 hour.

FIG. 4 shows I-V characteristics obtained after a heat treatment was performed at 500° C. for 1 hour, and FIG. 5 shows light response characteristics in a wavelength of 220 to 600 nm at an inverse voltage of 3.5 V obtained after a heat treatment. Even after the heat treatment at 500° C., the inverse dark current was $10^{-14}$ A or less, and the rising steepness of forward current was improved compared to that obtained before the heat treatment. In addition, the rectifier ratio with the forward current was nine orders of magnitude or more, and hence extremely heat-stable Schottky characteristics were shown. In addition, from the light response characteristics, the wavelength cutoff was approximately 260 nm, and a visible light blind ratio of approximately five orders of magnitude was obtained.

INDUSTRIAL APPLICABILITY

A conventional diamond ultraviolet sensing device uses a laminate or an alloy electrode material containing Au, and an intermetallic compound of Au has seriously poor thermal stability and also has poor mechanical strengths; hence, an ultraviolet sensing device having superior thermal stability cannot be manufactured. According to the present invention, since a heat-stable electrode was developed which could satisfactorily work even after being exposed to a high temperature atmosphere of 500° C., a heat-stable ultraviolet sensor could be developed.

The ultraviolet sensing device according to the present invention is applied to combustion control monitors used for an industrial combustion furnace, a gas turbine engine, a jet engine, and the like; a flame sensor for a flame detector which cooperates in combination with a fire alarm; a stepping aligner used for manufacturing of silicon large scale integrated circuits; and an ultraviolet sensor in ultraviolet irradiation apparatuses; hence, markets for new semiconductor sensing devices are developed.

REFERENCE NUMERALS

Figure 1:
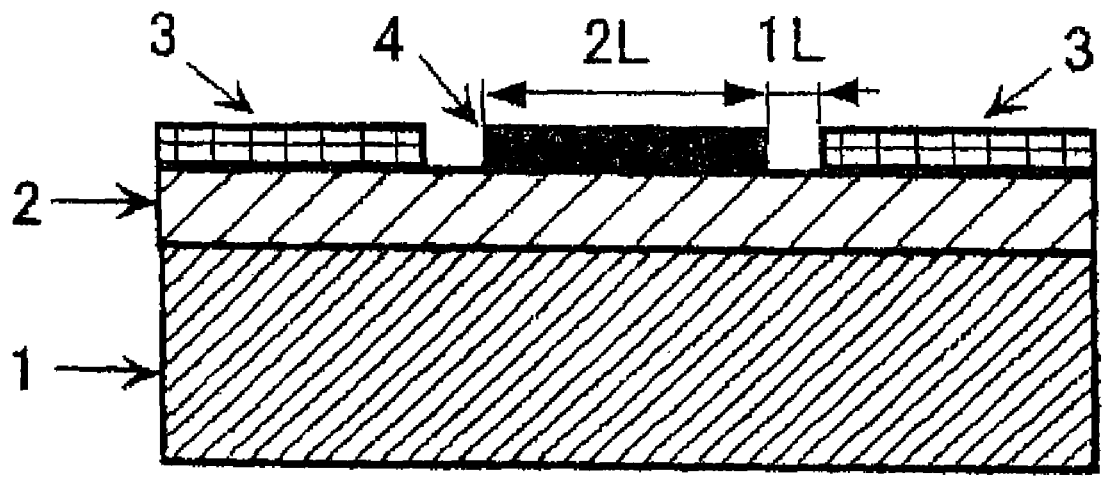
FIG. 1 is a cross-sectional view showing a diamond ultraviolet sensor according to the present invention.
Figure 2:
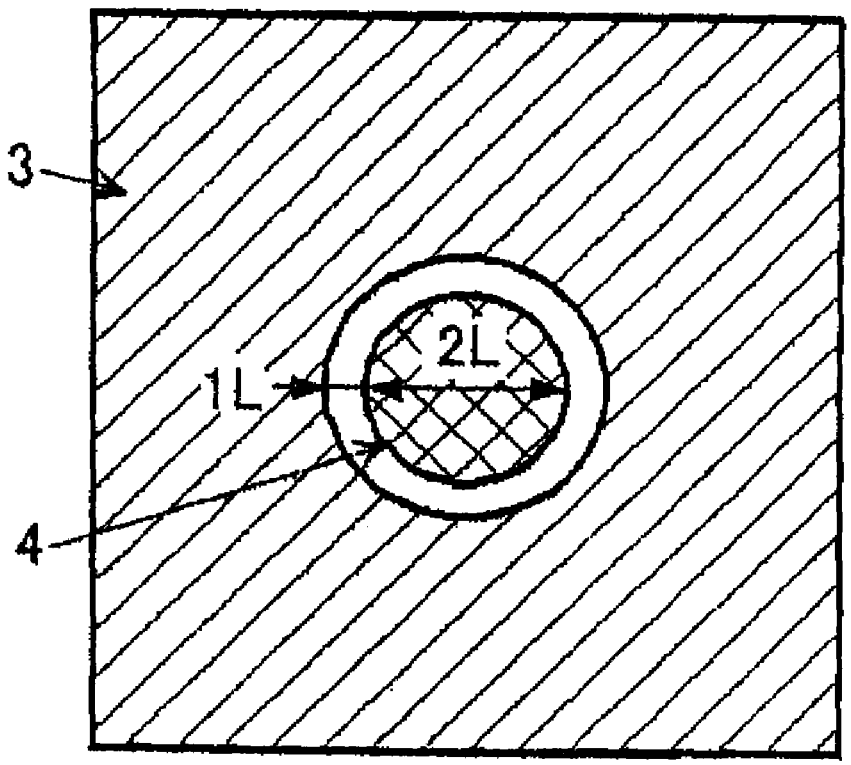
FIG. 2 is a plan view showing an electrode pattern of a diamond ultraviolet sensor according to the present invention.
Figure 3:
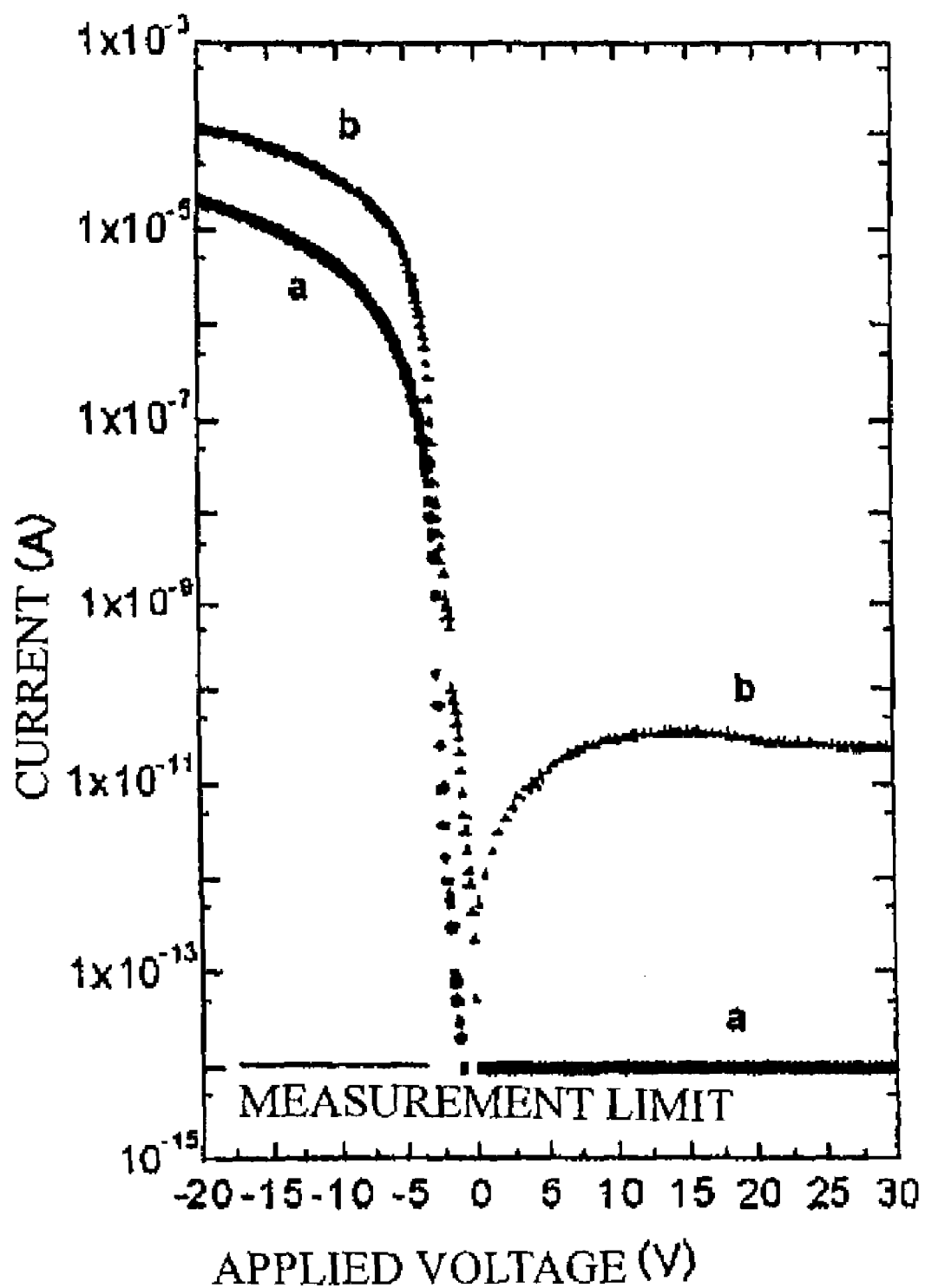
FIG. 3 is a graph in which (a) shows dark current I-V characteristics and (b) shows I-V characteristics measured while ultraviolet light having a wavelength of 220 nm is irradiated, of a diamond ultraviolet sensor according to the present invention.
Figure 4:
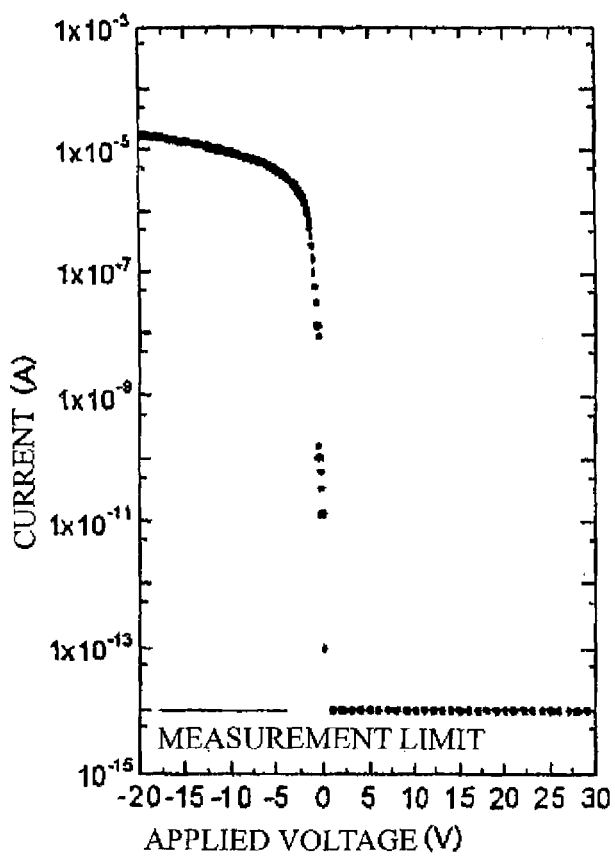
FIG. 4 is a graph showing dark current I-V characteristics of a diamond ultraviolet sensor according to the present invention, which are obtained after a heat treatment is performed at 500° C. for 1 hour.
Figure 5:
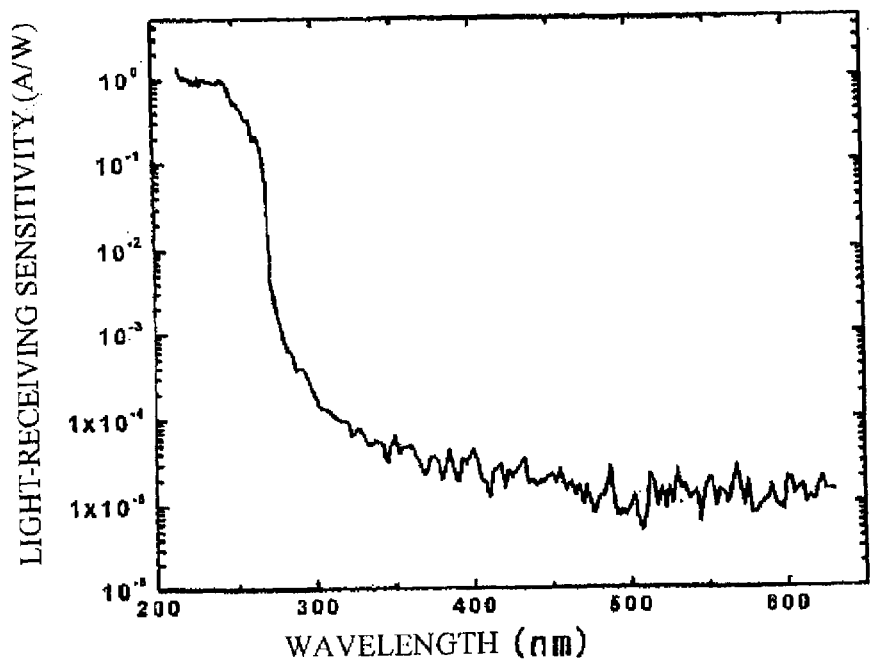
FIG. 5 is a graph showing light response characteristics of a diamond ultraviolet sensor according to the present invention, which are obtained after a heat treatment is performed at 500° C. for 1 hour.

1: diamond (100) single crystal substrate
2: diamond single crystal film
3: Ti/WC ohmic electrode
4: WC rectifier electrode

The invention claimed is:

1. A diamond ultraviolet sensor having a light-receiving sensitivity to ultraviolet light of a wavelength of 260 nm or less, comprising:
   a photoconductive type or a Schottky type light sensing device to detect light irradiated to a light-receiving unit by the change in electrical resistance of a light-receiving unit material or the change in light induced current, comprising:
   a diamond (100) or (111) plane single crystalline substrate,
   a diamond semiconductor epitaxially grown film formed on the diamond (100) or (111) plane single crystalline substrate, the diamond semiconductor epitaxially grown film having a surface obtained by removing a surface conductive layer by an oxidation treatment of a hydrogen-terminated surface or the diamond semiconductor epitaxially grown film,
   a rectifier electrode formed on the surface of the diamond semiconductor epitaxially grown film, the rectifier electrode being of a single layer containing no Au, and comprising at least one carbide compound selected from the group consisting of TiC, ZrC, HfC, VC, NbC, TaC, CrC, MoC, and WC, and
   an ohmic electrode formed on the surface of the diamond semiconductor epitaxially grown film, the ohmic electrode being of a two-layered laminate structure using no Au, comprising:
   a first layer of a single metal to form a solid solution with a carbide or carbon in the vicinity of a bonding interface between the diamond semiconductor epitaxially grown film and the ohmic electrode by reaction with the diamond through a heat treatment, and
   a second layer comprising at least one carbide compound selected from the group consisting of TiC, ZrC, HfC, VC, NbC, TaC, CrC, MoC, and WC, wherein the first layer and the second layer are processed by the heat treatment.

2. A diamond ultraviolet sensor comprising:
   a photoconductive type or a Schottky type light sensing device to detect light irradiated to a light-receiving unit by the change in electrical resistance of a light-receiving unit material or the change in light induced current, comprising:
   a diamond (100) or (111) plane single crystalline substrate,
   a diamond semiconductor epitaxially grown film formed on the diamond (100) or (111) plane single crystalline substrate, the diamond semiconductor epitaxially grown film having a surface obtained by removing a surface conductive layer, and
   an electrode layer in contact with the surface of the diamond semiconductor epitaxially grown film comprising at least one carbide compound selected from the group consisting of TiC, ZrC, HfC, VC, NbC, TaC, CrC, MoC, and WC.

3. A diamond ultraviolet sensor comprising:
   a photoconductive type or a Schottky type light sensing device to detect light irradiated to a light-receiving unit by the change in electrical resistance of a light-receiving unit material or the change in light induced current, comprising:
   a diamond semiconductor epitaxially grown film formed on a diamond (100) or (111) plane single crystalline substrate, the diamond semiconductor epitaxially grown film having a surface obtained by removing a surface conductive layer, and
   an ohmic electrode, in contact with the surface of the diamond semiconductor epitaxially grown film, the ohmic electrode including a topmost layer portion comprising at least one carbide compound of a high melting point metal element, which is selected from the group consisting of TiC, ZrC, HfC, VC, NbC, TaC, CrC, MoC, and WC.

4. The diamond ultraviolet sensor according to any one of claims 1, 2, or 3, wherein the diamond surface from which the surface conductive layer is removed is a surface formed by an oxidation treatment performed for a hydrogen terminated diamond surface.

* * * * *